(12) United States Patent
Furuta et al.

(10) Patent No.: US 10,111,335 B2
(45) Date of Patent: Oct. 23, 2018

(54) PRINTED WIRING BOARD

(71) Applicant: IBIDEN CO., LTD., Ogaki (JP)

(72) Inventors: Toru Furuta, Ogaki (JP); Masashi Awazu, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/670,185

(22) Filed: Aug. 7, 2017

(65) Prior Publication Data

US 2018/0042114 A1    Feb. 8, 2018

(30) Foreign Application Priority Data

Aug. 5, 2016  (JP) .................. 2016-154397

(51) Int. Cl.
*H05K 1/16* (2006.01)
*H05K 1/18* (2006.01)
*H05K 3/46* (2006.01)
*H01L 23/00* (2006.01)

(52) U.S. Cl.
CPC .............. *H05K 1/185* (2013.01); *H01L 24/20* (2013.01); *H01L 24/32* (2013.01); *H05K 1/16* (2013.01); *H05K 3/4682* (2013.01)

(58) Field of Classification Search
CPC ........ H05K 1/185; H05K 1/16; H05K 3/4382; H01L 24/20; H01L 24/32
USPC ....................................... 174/260
See application file for complete search history.

(56) References Cited

U.S. PATENT DOCUMENTS

| | | | |
|---|---|---|---|
| 2012/0153493 A1* | 6/2012 | Lee ................ | H01L 25/16 257/774 |
| 2012/0189826 A1* | 7/2012 | Hayashi ............ | H05K 3/4602 428/195.1 |
| 2014/0226290 A1* | 8/2014 | Hayashi ............ | H05K 3/4655 361/748 |
| 2015/0016079 A1* | 1/2015 | Furutani ............ | H05K 1/185 361/763 |

FOREIGN PATENT DOCUMENTS

JP         2007-150002 A         6/2007

* cited by examiner

*Primary Examiner* — Steven T Sawyer
(74) *Attorney, Agent, or Firm* — Oblon, McClelland, Maier & Neustadt, L.L.P.

(57) ABSTRACT

A printed wiring board includes a central resin insulating layer, an electronic component embedded in the central resin insulating layer, a first resin insulating layer formed on a first surface side of the central resin insulating layer, and a second resin insulating layer formed on a second surface side of the central resin insulating layer on the opposite side with respect to the first surface side. The central resin insulating layer does not contain a core material, and one of the first resin insulating layer and the second resin insulating layer includes a core material and the other one of the first resin insulating layer and the second resin insulating layer does not contain a core material.

20 Claims, 5 Drawing Sheets

PRINTED WIRING BOARD

CROSS-REFERENCE TO RELATED APPLICATIONS

The present application is based upon and claims the benefit of priority to Japanese Patent Application No. 2016-154397, filed Aug. 5, 2016, the entire contents of which are incorporated herein by reference.

BACKGROUND OF THE INVENTION

Field of the Invention

The present invention relates to a printed wiring board with a built-in electronic component.

Description of Background Art

Japanese Patent Laid-Open Publication No. 2007-150002 describes a substrate with a built-in IC. The entire contents of this publication are incorporated herein by reference.

SUMMARY OF THE INVENTION

According to one aspect of the present invention, a printed wiring board includes a central resin insulating layer, an electronic component embedded in the central resin insulating layer, a first resin insulating layer formed on a first surface side of the central resin insulating layer, and a second resin insulating layer formed on a second surface side of the central resin insulating layer on the opposite side with respect to the first surface side. The central resin insulating layer does not contain a core material, and one of the first resin insulating layer and the second resin insulating layer includes a core material and the other one of the first resin insulating layer and the second resin insulating layer does not contain a core material.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
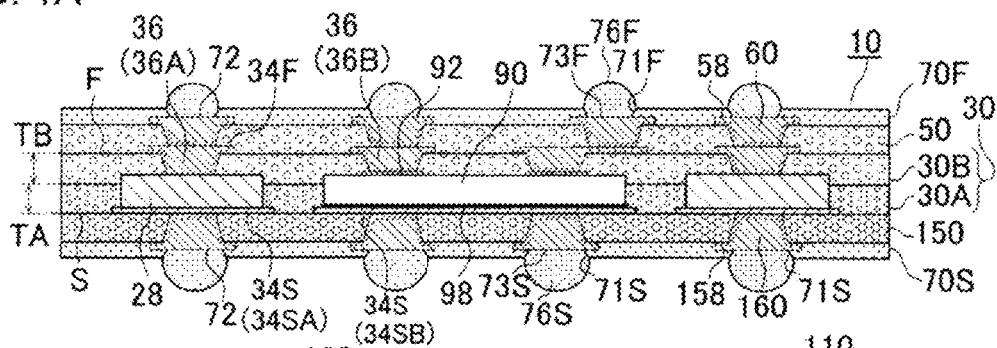
FIGS. 1A and 1B are cross-sectional views of a printed wiring board according to an embodiment of the present invention.

Embodiments will now be described with reference to the accompanying drawings, wherein like reference numerals designate corresponding or identical elements throughout the various drawings.

Embodiment

FIG. 1A is a cross-sectional view of a printed wiring board of an embodiment.

A printed wiring board 10 of the embodiment includes three resin insulating layers: a central resin insulating layer 30 that has a first surface (F) on a side where an IC chip is mounted and a second surface (S) that is on an opposite side of the first surface, and accommodates an electronic component 90 such as an IC; a first resin insulating layer 50 that is formed on the first surface side of the central resin insulating layer; and a second resin insulating layer 150 that is formed on the second surface side of the central resin insulating layer. A first conductor layer (34F) is formed on the first surface of the central resin insulating layer and a second conductor layer (34S) is formed on the second surface of the central resin insulating layer. An uppermost conductor layer 58 is formed on the first resin insulating layer 50. A lowermost conductor layer 158 is formed on the second resin insulating layer 150. The printed wiring board includes four conductor layers, which are the first conductor layer (34F), the second conductor layer (34S), the uppermost conductor layer 58, and the lowermost conductor layer 158. Via conductors 36 are formed on the first surface (F) side of the central resin insulating layer 30, and metal posts 28 are formed on the second surface (S) side of the central resin insulating layer 30. The metal posts 28 are connected to the second conductor layer (34S) on the second surface side of the central resin insulating layer 30. The via conductors 36 include main via conductors (36A) that are respectively connected to the metal posts 28 and sub via conductors (36B) that are respectively connected to terminals 92 of the electronic component 90. The second conductor layer (34S) includes a second main conductor circuit (34SA) that is connected to the metal posts 28 and a second sub conductor circuit (34SB) on which the electronic component is mounted. The electronic component 90 is fixed to the second sub conductor circuit (34SB) via an adhesive layer 98. The first conductor layer (34F) on the first surface side of the central resin insulating layer 30 and the second main conductor circuit (34SA) on the second surface side of the central resin insulating layer 30 are connected to each other via the main via conductors (36A) and the metal posts 28. The first conductor layer (34F) and the uppermost conductor layer 58 are connected to each other via via conductors 60 formed in the first resin insulating layer 50. The second conductor layer (34S) and the lowermost conductor layer 158 are connected to each other via via conductors 160 formed in the second resin insulating layer 150. A solder resist layer (70F) is formed on the first resin insulating layer 50 and the uppermost conductor layer 58. Solder bumps (76F) for mounting an electronic component such as an IC chip are formed in openings (71F) of the solder resist layer (70F). A solder resist layer (70S) is formed on the second resin insulating layer 150 and the lowermost conductor layer 158. Solder bumps (76S) for connecting an external substrate such as a motherboard are formed in openings (71S) of the soldier resist layer (70S).

In the printed wiring board of the embodiment, the central resin insulating layer 30 includes two layers, a lower resin insulating layer (30A) and an upper resin insulating layer (30B). The lower resin insulating layer (30A) and the upper resin insulating layer (30B) do not contain a core material, but have different content rates of inorganic particles and have different thermal expansion coefficients. That is, the upper resin insulating layer (30B) has a higher content rate (w %) of inorganic particles and a lower thermal expansion coefficient than the lower resin insulating layer (30A). This relaxes a stress due to a difference in thermal expansion between the first resin insulating layer 50, which does not contain a core material and has a high thermal expansion coefficient, and the second resin insulating layer 150, which contains a core material and has a low thermal expansion coefficient, and reduces warpage of the printed wiring board. In the printed wiring board of the embodiment, a thickness (TA) of the lower resin insulating layer (30A) and a thickness (TB) of the upper resin insulating layer (30B) are substantially equal to each other.

Figure 1B:
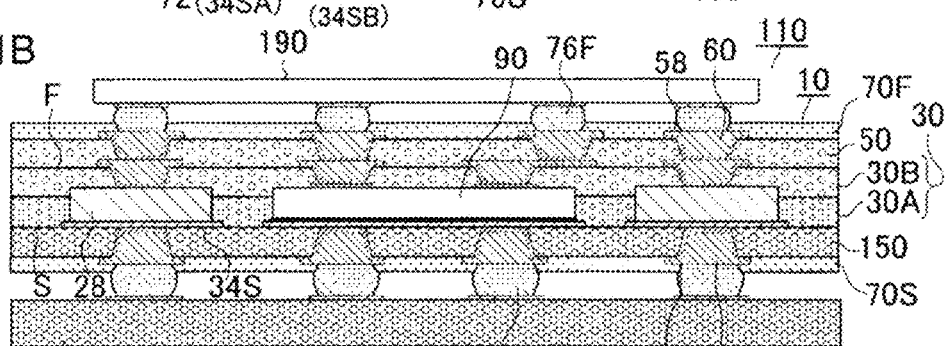

FIG. 1B illustrates an application example 110 of the printed wiring board of the embodiment.

An IC chip 190 is mounted on the upper solder bumps (76F). The application example 110 is mounted on a motherboard 194 via lower solder bumps (76S).

A diameter of each of the metal posts 28 is desirably at least twice as large as a bottom diameter of each of the main via conductors (36A). This increases connection reliability between the main via conductors and the metal posts 28.

Heights of upper surfaces of the metal posts 28 and upper surfaces of the terminals 92 of the IC chip 90 are substantially equal to each other. Therefore, a depth (height) of each of the main via conductors (36A) connected to the metal posts 28 and a depth (height) of each of the sub via conductors (36B) connected to the terminals 92 of the IC chip are substantially equal to each other. That is, a height difference between the main via conductors (36A) and the sub via conductors (36B) is small. Therefore, the main via conductors (36A) and the sub via conductors (36B) can be simultaneously formed with high reliability.

In the printed wiring board of the embodiment, the first surface (F) and the second surface (S) of the thick central resin insulating layer 30 with the built-in electronic component are connected to each other via the main via conductors (36A) and the metal posts 28. Therefore, since the depth of each of the main via conductors (36A) is small, a void or the like becomes less likely to occur, and connection reliability of the main via conductors (36A) is improved.

In the printed wiring board of the embodiment, the central resin insulating layer 30 and the first resin insulating layer 50 each do not contain a core material and are each formed from a resin containing inorganic particles. The second resin insulating layer 150 is formed by curing a prepreg obtained by impregnating a core material such as a glass cloth with an insulating resin containing inorganic particles. Only one layer, the second resin insulating layer 150, contains a core material that causes an increase in layer thickness. Therefore, the thickness of the printed wiring board can be reduced. Here, in the printed wiring board, a conductor layer on the IC chip mounting side has a higher wiring density than a conductor layer on the external substrate side (wirings spread downward). Here, a thin layer that does not contain a core material is arranged on the first resin insulating layer on the IC chip mounting side. Therefore, high integration of the printed wiring board can be achieved.

Manufacturing Method of Embodiment

A method for manufacturing the printed wiring board of the embodiment is illustrated in FIG. 2A-5D.

Figure 2A:
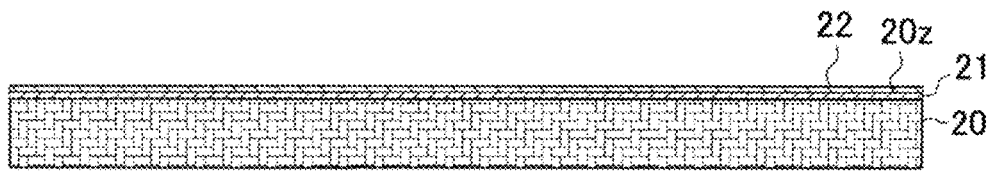
FIG. 2A-2E are manufacturing process diagrams of the printed wiring board of the embodiment.
Figure 2B:
Figure 2C:

A resin substrate 20 on which a carrier copper foil 21 is laminated is prepared, and a support plate (20z) obtained by affixing an ultra-thin copper foil 22 on the carrier copper foil 21 is prepared (FIG. 2A). A plating resist 84 of a predetermined pattern is formed on the ultra-thin copper foil 22 of the support plate (20z) (FIG. 2B). An electrolytic copper plating film 85 that forms the second conductor layer (34S) is formed in a non-forming portion of the plating resist by electrolytic copper plating (FIG. 2C).

Figure 2D:
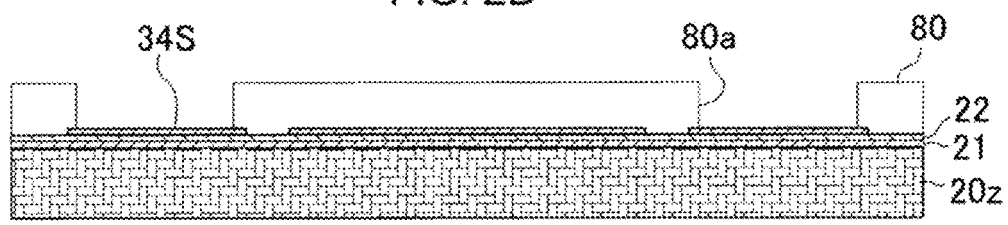
Figure 2E:
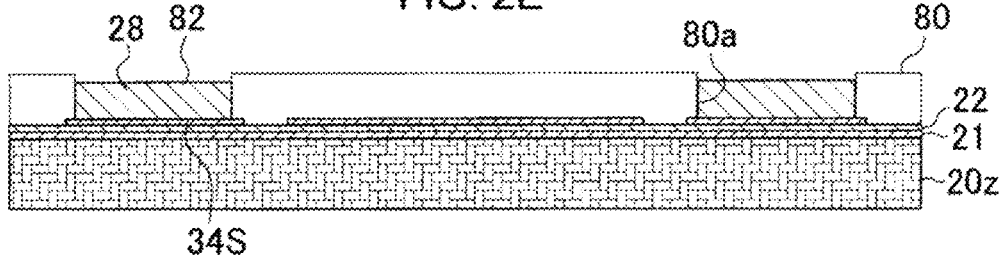
Figure 3A:
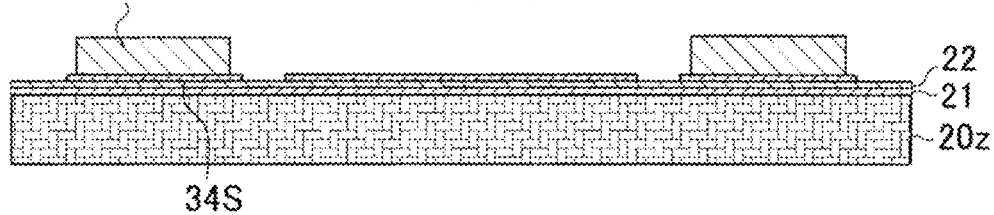
FIG. 3A-3E are manufacturing process diagrams of the printed wiring board of the embodiment.
Figure 3B:
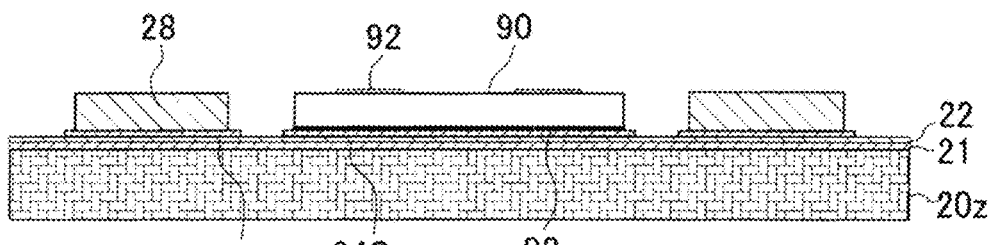

The plating resist is peeled off. A second plating resist 80 having openings (80a) for forming the metal posts is formed (FIG. 2D). An electrolytic plating film 82 for forming the metal posts is formed in the openings (80a) (FIG. 2E). The second plating resist is peeled off, and the metal posts 28 are exposed (FIG. 3A). The electronic component 90 is fixed on the second sub conductor circuit (34SB) via the adhesive layer 98 (FIG. 3B).

Figure 3C:
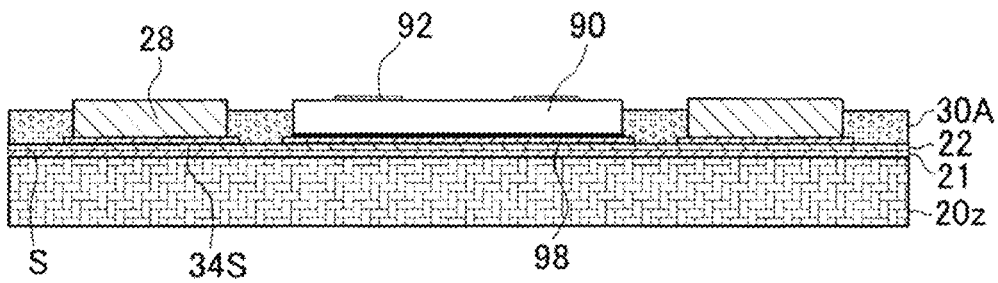
Figure 3D:
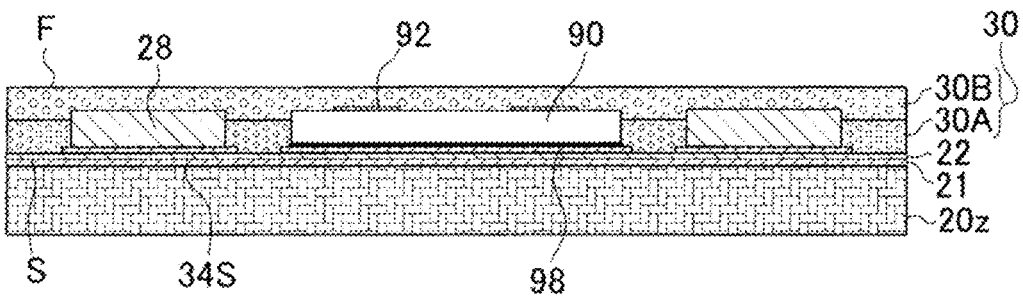

The lower resin insulating layer (30A) is formed on the support plate (20z) on which the metal posts 28 are formed and the electronic component is fixed (FIG. 3C). The lower resin insulating layer (30A) is formed from a resin that does not contain a core material but contains particles. Examples of the resin include an epoxy resin, a BT (bismaleimide triazine) resin, and the like. The particles include inorganic particles such as silica particles and thermosetting resin particles such as epoxy particles. Further, the upper resin insulating layer (30B) is formed on the lower resin insulating layer (30A), and the central resin insulating layer 30 is completed (FIG. 3D). The upper resin insulating layer (30B) has the same resin component as the lower resin insulating layer (30A), but contains more inorganic particles.

Figure 3E:
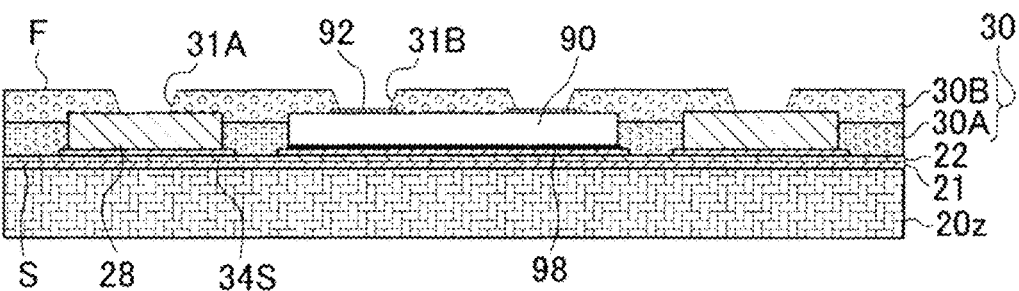

Openings (31A) for the via conductors reaching the metal posts 28 and openings (31B) reaching the terminals 92 of the electronic component are formed in the central resin insulating layer 30 using $CO_2$ gas laser (FIG. 3E).

Figure 4A:
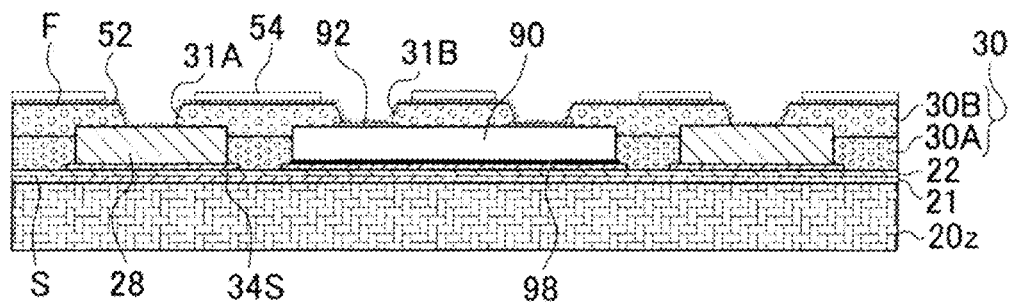
FIG. 4A-4D are manufacturing process diagrams of the printed wiring board of the embodiment.
Figure 4B:
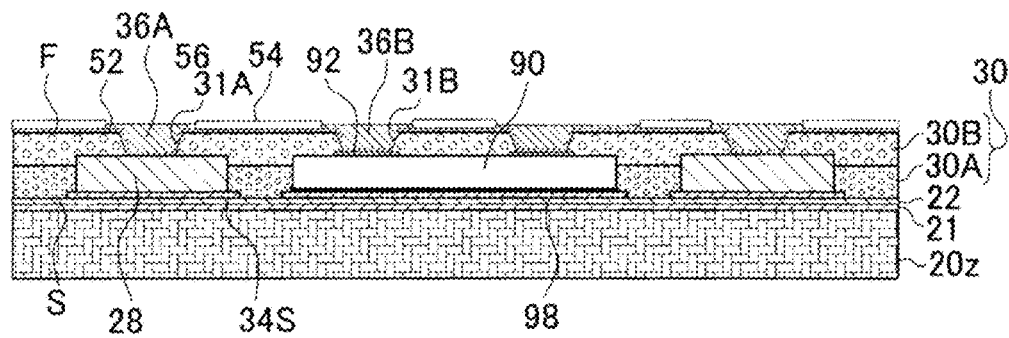

An electroless copper plating film 52 is formed on the resin insulating layer 30 and on inner walls of the openings (31A, 31B), and a plating resist 54 is formed on the electroless copper plating film 52 (FIG. 4A). An electrolytic copper plating film 56 is formed on the electroless copper plating film 52 exposed from the plating resist 54. In this case, the openings (31A, 31B) are filled with the electrolytic copper plating film 56. The main via conductors (36A) connected to the metal posts 28 are formed in the openings (31A), and the sub via conductors (36B) connected to the terminals 92 of the electronic component 90 are formed in the openings (31B) (FIG. 4B). As described above, the difference between the depth (height) of each of the main via conductors (36A) connected to the metal posts 28 and the depth (height) (TB) of each of the sub via conductors (36B) connected to the terminals 92 of the IC chip is small. Therefore, the main via conductors (36A) and the sub via conductors (36B) can be simultaneously formed with high reliability.

Figure 4C:
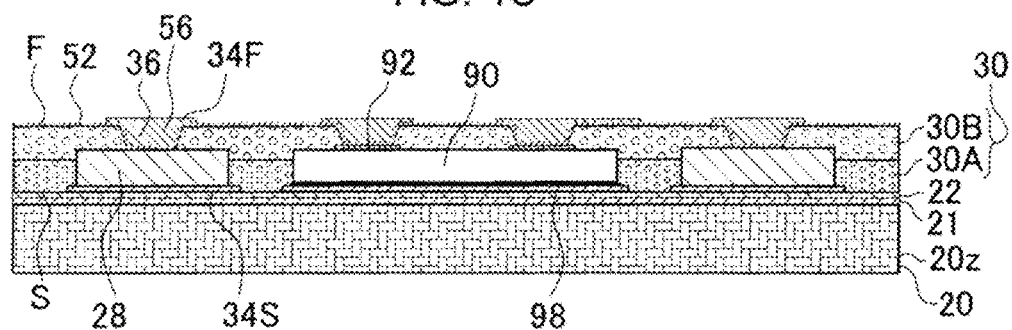
Figure 4D:
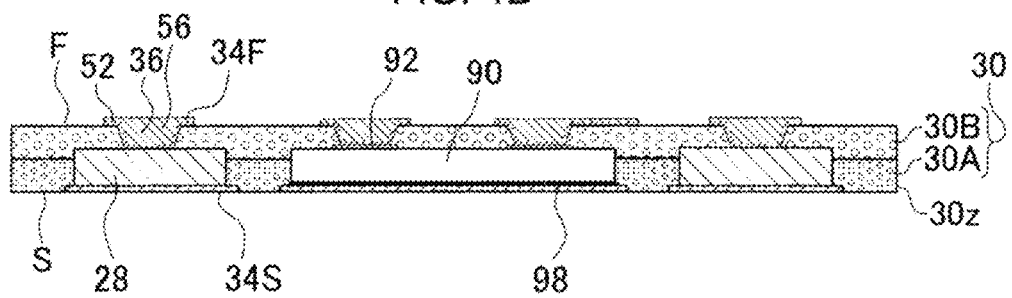

The plating resist is removed (FIG. 4C). After the carrier copper foil 21 and the ultra-thin copper foil 22 of the support plate (20z) are mechanically separated, the ultra-thin copper foil 22 is peeled off by etching, and, at the same time, the electroless copper plating film 52 exposed from the electrolytic copper plating film 56 is removed. An intermediate substrate (30z) including the central resin insulating layer 30, the first conductor layer (34F), the second conductor layer (34S), the via conductors 36, and the metal posts 28 is completed (FIG. 4D). The central resin insulating layer 30 has the first surface (F) on an upper side and the second surface (S) on an opposite side of the first surface.

Figure 5A:
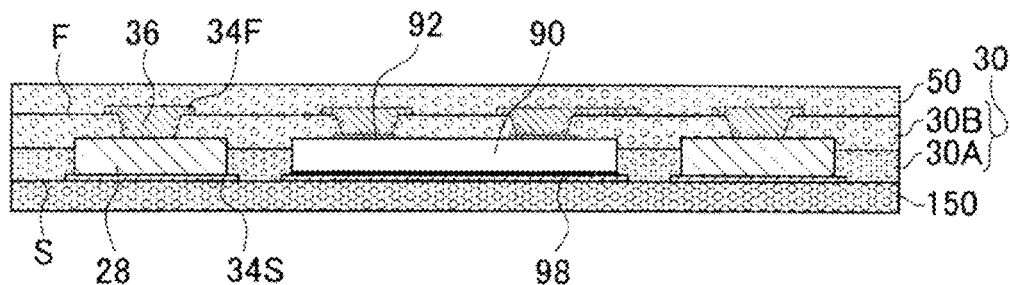
FIG. 5A-5D are manufacturing process diagrams of the printed wiring board of the embodiment.

The first resin insulating layer 50 formed from a resin that does not contain a core material but contain particles is laminated on the first surface (F) side of the central resin insulating layer 30, and the second resin insulating layer 150 formed from a resin that contains a core material (reinforcing material) and particles is laminated on the second surface (S) side of the central resin insulating layer 30 (FIG. 5A). The second resin insulating layer 150 is formed of a resin and a reinforcing material. Examples of the reinforcing material include a glass cloth, aramid fiber, glass fiber, and the like. A prepreg can be used for the second resin insulating layer 150.

Figure 5B:
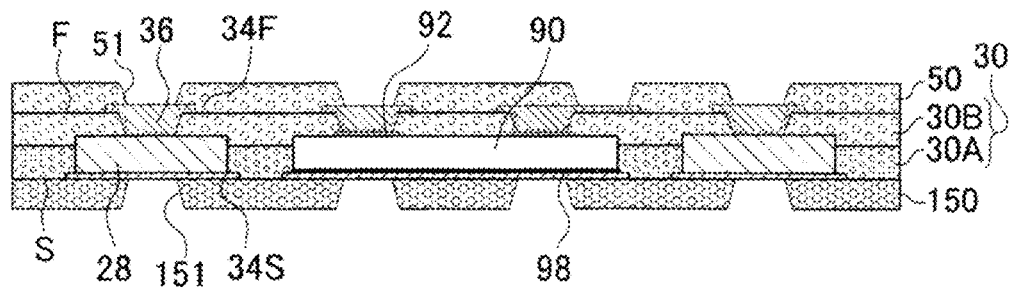

Using laser, openings 51 reaching the first conductor layer (34F) are formed in the first resin insulating layer 50, and openings 151 reaching the second conductor layer (34S) are formed in the second resin insulating layer 150 (FIG. 5B).

Figure 5C:
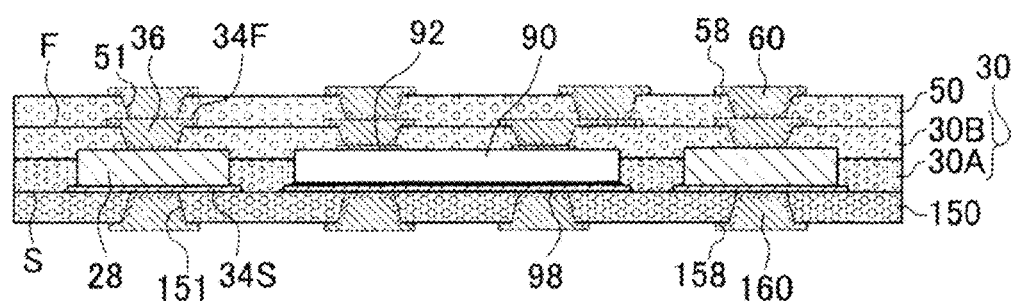
Figure 5D:
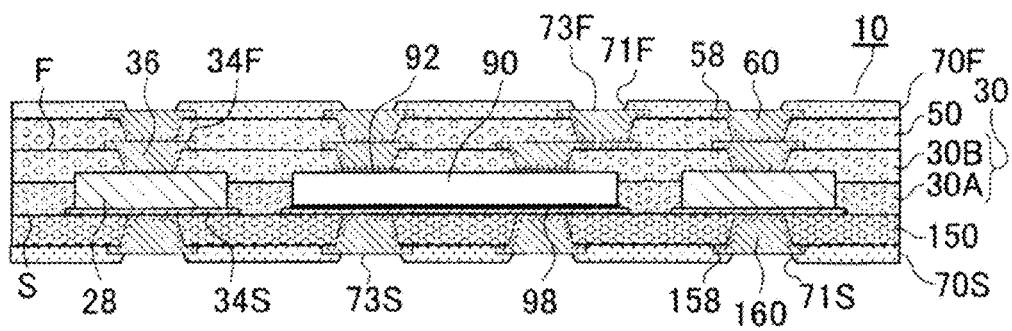

An electroless plating film is formed on the first resin insulating layer 50 and the second resin insulating layer 150. A plating resist is formed. An electrolytic plating film is formed in a non-forming portion of the plating resist. After the plating resist is peeled off, the electroless plating film in a non-forming portion of the electrolytic plating film is removed. The via conductors 60 and the uppermost conductor layer 58 are formed in or on the first resin insulating layer 50. The via conductors 160 and the lowermost conductor layers 158 are formed in or on the second resin insulating layer 150 (FIG. 5C).

The upper side solder resist layer (70F) having the openings (71F) is formed on the first resin insulating layer 50, and the lower side solder resist layer (70S) having the openings (71S) is formed on the second resin insulating layer 150. Upper surfaces of pads (73F) are respectively exposed from the openings (71F) of the upper side solder resist layer (70F). On the other hand, upper surfaces of portions of the lowermost conductor layer 158 that are respectively exposed from the openings (71S) of the lower side solder resist layer (70S) function as pads (73S) for connecting to a motherboard.

A nickel plating layer is formed on each of the pads (73F, 73S). Further, a gold plating layer is formed on the nickel plating layer. A metal film 72 including the nickel plating layer and the gold plating layer is formed. Instead of the nickel-gold layer, it is also possible that a nickel-palladium-gold layer or an OSP film is formed. Solder balls are respectively mounted on the pads (73F, 73S), and the solder bumps (76F, 76S) are formed by reflow. The printed wiring board 10 is completed (FIG. 1A).

The electronic component 190 such as an IC chip is mounted via the solder bumps (76F) of the printed wiring board 10, and the application example 110 is completed. The application example 110 is mounted on the external substrate 194 such as a motherboard via the solder bumps (76S) (FIG. 1B).

First Modified Example of Embodiment

Figure 1C:
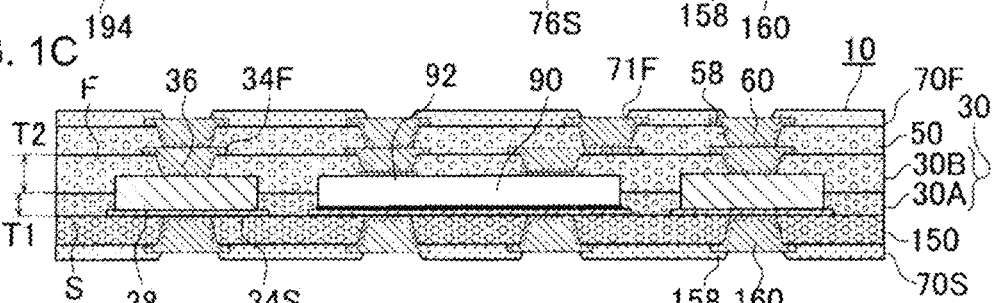
FIG. 1C is a cross-sectional view of a printed wiring board according to a first modified example of the embodiment.

FIG. 1C is a cross-sectional view of a printed wiring board according to a first modified example of the embodiment.

In the first modified example of the embodiment, relatively, the lower resin insulating layer (30A) has a smaller thickness (T1), and the upper resin insulating layer (30B) has a larger thickness (T2). By adjusting the thermal expansion coefficients and the thicknesses of the lower resin insulating layer (30A) and the upper resin insulating layer (30B), a warpage amount of the printed wiring board is reduced.

Second Modified Example of Embodiment

Figure 1D:
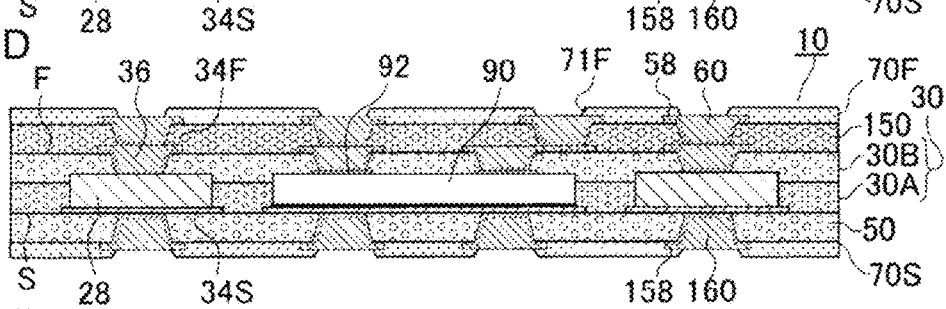
FIG. 1D is a cross-sectional view of a printed wiring board according to a second modified example of the embodiment.

FIG. 1D is a cross-sectional view of a printed wiring board according to a second modified example of the embodiment.

In the second modified example of the embodiment, the second resin insulating layer 150 containing a core material is formed on the first surface (F) side of the central resin insulating layer 30, and the first resin insulating layer 50 that does not contain a core material is formed on the second surface (S) side of the central resin insulating layer 30. In the printed wiring board of the second modified example of the embodiment, only one resin insulating layer contains a core material. Therefore, the thickness of the printed wiring board can be reduced.

Third Modified Example of Embodiment

Figure 1E:
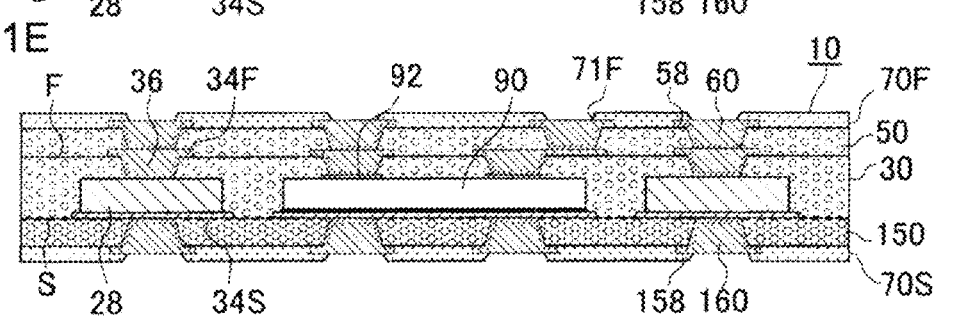
FIG. 1E is a cross-sectional view of a printed wiring board according to a third modified example of the embodiment.

FIG. 1E is a cross-sectional view of a printed wiring board according to a third modified example of the embodiment.

In the third modified example of the embodiment, the central resin insulating layer 30 has a single-layer structure. Also in the printed wiring board of the third modified example, the central resin insulating layer 30 and the first resin insulating layer 50 are each formed from an insulating resin that does not contain a core material. The second resin insulating layer 150 is formed by curing a prepreg obtained by impregnating a core material with an insulating resin containing inorganic particles. Only one layer, the second resin insulating layer 150, contains a core material that causes an increase in layer thickness. Therefore, the thickness of the printed wiring board can be reduced.

Japanese Patent Laid-Open Publication No. 2007-150002 describes a substrate with a built-in IC. The substrate has a structure in which the IC is embedded in a resin layer that does not contain a core material, and the resin layer is sandwiched between two front and back core layers that each contain a core material.

In Japanese Patent Laid-Open Publication No. 2007-150002, the resin layer containing the IC is sandwiched between the two core layers that each contains a core material. Since the core layers that each contains a core material are thick, the printed wiring board is likely to become thick.

A printed wiring board according to an embodiment of the present invention includes: a central resin insulating layer that has a first surface and a second surface (that is on an opposite side of the first surface) and does not contain a core material, an electronic component being embedded in the central resin insulating layer; a first resin insulating layer that is formed on the first surface side of the central resin insulating layer; and a second resin insulating layer that is formed on the second surface side of the central resin insulating layer. One of the first resin insulating layer and the second resin insulating layer contains a core material and the other does not contain a core material.

According to an embodiment of the present invention, only one of the first resin insulating layer on the first surface side and the second resin insulating layer on the second surface side of the central resin insulating layer containing the electronic component contains a core material. Therefore, a thickness of the printed wiring board can be reduced.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
   a central resin insulating layer comprising a first layer and a second layer;
   an electronic component embedded in the central resin insulating layer;
   a first resin insulating layer formed on a first surface side of the central resin insulating layer;
   a second resin insulating layer formed on a second surface side of the central resin insulating layer on an opposite side with respect to the first surface side;
   a plurality of via conductors formed in the central resin insulating layer such that the plurality of via conductors is formed toward the first surface side; and
   a plurality of metal posts formed in the central resin insulating layer such that the plurality of metal posts is formed toward the second surface side,
   wherein the central resin insulating layer does not contain a core material, one of the first resin insulating layer and the second resin insulating layer includes a core material and the other one of the first resin insulating layer and the second resin insulating layer does not contain a core material, the central resin insulating layer comprises the first layer on the first surface side and the second layer on the second surface side formed such that the second layer has a thermal expansion coefficient that is greater than a thermal expansion coefficient of the first layer and that the first layer has a thickness that is smaller than a thickness of the second layer, the plurality of via conductors includes a group of via conductors connected with the plurality of metal posts respectively such that a via conductor and a respective metal post connected to the via conductor is connecting a first surface of the central resin insulating layer and a second surface of the central resin insulating layer on an opposite side, and the plurality of meal posts is formed such that each of the metal posts has a diameter that is at least twice as large as a bottom diameter of each via conductor in the group of the via conductors connected with the metal posts.

2. A printed wiring board according to claim 1, further comprising: a plurality of pads formed on the first resin insulating layer such that the plurality of pads is positioned to mount a second electronic component on the first resin insulating layer, wherein the first resin insulating layer does not contain the core material, and the second resin insulating layer includes the core material.

3. A printed wiring board according to claim 1, further comprising: a first solder resist layer formed on a surface of the first resin insulating layer; and a second solder resist layer formed on a surface of the second resin insulating layer.

4. A printed wiring board according to claim 2, further comprising: a first solder resist layer formed on a surface of the first resin insulating layer; and a second solder resist layer formed on a surface of the second resin insulating layer.

5. A printed wiring board according to claim 1, further comprising: a plurality of pads formed on the first resin insulating layer.

6. A printed wiring board according to claim 5, further comprising: a first solder resist layer formed on a surface of the first resin insulating layer; and a second solder resist layer formed on a surface of the second resin insulating layer.

7. A printed wiring board according to claim 1, further comprising:
   a plurality of pads formed on the first resin insulating layer such that the plurality of pads is positioned to mount a second electronic component on the first resin insulating layer.

8. A printed wiring board according to claim 7, further comprising: a first solder resist layer formed on a surface of the first resin insulating layer; and a second solder resist layer formed on a surface of the second resin insulating layer.

9. A printed wiring board according to claim 1, further comprising: a plurality of pads formed on the first resin insulating layer, wherein the first resin insulating layer does not contain the core material, and the second resin insulating layer includes the core material.

10. A printed wiring board according to claim 9, further comprising: a first solder resist layer formed on a surface of the first resin insulating layer; and a second solder resist layer formed on a surface of the second resin insulating layer.

11. A printed wiring board according to claim 1, wherein the first resin insulating layer does not contain the core material, and the second resin insulating layer includes the core material.

12. A printed wiring board according to claim 11, further comprising: a first solder resist layer formed on a surface of the first resin insulating layer; and a second solder resist layer formed on a surface of the second resin insulating layer.

13. A printed wiring board according to claim 1, further comprising: a first solder resist layer formed on a surface of the first resin insulating layer.

14. A printed wiring board according to claim 1, further comprising: a second solder resist layer formed on a surface of the second resin insulating layer.

15. A printed wiring board according to claim 2, further comprising: a first solder resist layer formed on a surface of the first resin insulating layer.

16. A printed wiring board according to claim 2, further comprising: a second solder resist layer formed on a surface of the second resin insulating layer.

17. A printed wiring board according to claim 5, further comprising: a first solder resist layer formed on a surface of the first resin insulating layer.

18. A printed wiring board according to claim 5, further comprising: a second solder resist layer formed on a surface of the second resin insulating layer.

19. A printed wiring board according to claim 7, further comprising: a first solder resist layer formed on a surface of the first resin insulating layer.

20. A printed wiring board according to claim 7, further comprising: a second solder resist layer formed on a surface of the second resin insulating layer.

* * * * *